United States Patent [19]

Wada et al.

[11] Patent Number: 5,563,820
[45] Date of Patent: Oct. 8, 1996

[54] SEMICONDUCTOR MEMORY DEVICE HAVING TWO LAYERS OF BIT LINES ARRANGED CROSSING WITH EACH OTHER

[75] Inventors: Tomohisa Wada; Motomu Ukita, both of Hyogo, Japan

[73] Assignee: Mitsubishi Denki Kabushiki Kaisha, Tokyo, Japan

[21] Appl. No.: 347,092

[22] Filed: Nov. 23, 1994

[30] Foreign Application Priority Data

Dec. 22, 1993 [JP] Japan .................................. 5-324762

[51] Int. Cl.⁶ .................................................. G11C 5/06
[52] U.S. Cl. ............................... 365/63; 365/51; 365/206
[58] Field of Search ............................... 365/51, 63, 190, 365/202, 230.06, 206

[56] References Cited

U.S. PATENT DOCUMENTS

| 4,907,203 | 3/1990 | Wada et al. | 365/238.5 |
| 5,214,601 | 5/1993 | Hidaka et al. | 365/63 |
| 5,280,441 | 1/1994 | Wada et al. | 365/63 |

FOREIGN PATENT DOCUMENTS 3-8200  1/1991  Japan .
4-228188  8/1992  Japan .

OTHER PUBLICATIONS

"Bit Line Configuration Suitable for Very High Speed SRAM—T-Shaped Bit Line Configuration and Application to BICMOS 256K TTL SRAM", T. Kenkyukai et al., pp. 117–123, Jun. 21, 1991.

"A 5.8-NS 256-KB BICMOS TTL SRAM With T-Shaped Bit Line Architecture", Toru Shiomi et al., IEEE Journal of Solid-State Circuits, vol. 28, No. 12, Dec. 1993.

"New Bit Line Architecture for Ultra High Speed SRAMS" Shiomi et al., IEEE 1991 Custom Integrated Circuits Conference.

*Primary Examiner*—Joseph A. Popek
*Attorney, Agent, or Firm*—Lowe, Price, LeBlanc & Becker

[57] ABSTRACT

Bit lines which are adjacent to each other are connected to bit line signal input/output lines which are not adjacent to each other, via through holes. By this connection, data input/output lines, shield lines and a global word line are arranged between the through holes, whereby the distance between the through holes can be widened, minimum space between the bit lines can be widened, and therefore, higher integration of the memory array is realized.

15 Claims, 16 Drawing Sheets

SEMICONDUCTOR MEMORY DEVICE HAVING TWO LAYERS OF BIT LINES ARRANGED CROSSING WITH EACH OTHER

BACKGROUND OF THE INVENTION

1. Field of the Invention

The present invention relates to a semiconductor device and, more specifically, to a semiconductor memory device having bit lines for inputting/outputting data of memory cells.

2. Description of the Background Art

Recently, in equipments for office automation, equipments for engineering work stations and the like, an SRAM (Static Random Access Memory) having large capacity and operating at high speed has come to be used as a cache memory. Accordingly, higher speed of operation and larger capacity of the SRAM has been desired. In order to meet such a demand, a semiconductor memory device having a T-shaped bit line configuration is proposed in Japanese Patent Laying-Open No. 4-228188 and in "Bit Line Configuration Suitable for Very High Speed SRAM—T-Shaped Bit Line Configuration and Application to BiCMOS 256K TTL SRAM", Tsushingakkai Kenkyukai (Society of Communication Engineers Workshop) (CAS91-58, SDM91-63, ICD91-67). In the T-shaped bit line configuration, the bit line includes a first metal layer and a second metal layer connected to each other, and word lines and bit lines of the second metal layer are arranged parallel to each other. As a result, by virtue of the T-shaped bit line configuration, the column pitch is released in the ratio of the number of columns with respect to the number of rows in one block, whereby the column pitch can be widened, which contributes to higher degree of integration.

The aforementioned conventionally proposed semiconductor memory device will be described with reference to the figures. FIG. 13 is a block diagram showing the structure of a memory cell array and peripheral portion of a conventional semiconductor memory device.

Referring to FIG. 13, the convention semiconductor memory device includes bit line peripheral circuits 101 to 103, a row decoder 104, a memory cell MC, bit lines BL1 to BLn and /BL1 to /BLn, word lines WL1 to WLm, and bit line signal input/output lines L1 to Ln and /L1 to /Ln.

Word lines WL1 to WLm are provided crossing a plurality of bit lines BL$_1$ to BLn and /BL1 to /BLn. Adjacent bit lines constitute a bit line pair ("/" represents a complementary signal line). For example, bit lines BL1 and /BL1 form one bit line pair, and bit lines BL2 and /BL2 form a bit line pair. At each cross point of the bit line pair and the word line, a memory cell MC which is a static memory cell, is arranged, thus providing a memory cell array.

Each of the word lines WL1 to WLm receive an output signal from row decoder 104. Row decoder 104 decodes a row address signal applied through an address buffer (not shown) and selects one of the word lines WL1 to WLm. At one end of each of the bit line pairs BL1, /BL1, ..., BLn, /BLn, a bit line peripheral circuit 101 is provided. At the other end of each of the bit line pairs BL1, /BL1, ..., BLn, /BLn, a bit line peripheral circuit 102 is provided.

Further, bit line signal input/output lines L1, /L1, ..., Ln, /Ln are provided crossing bit lines BL1, /BL1, ..., BLn, /BLn. Bit line signal input/output lines L1, /L1, ..., Ln, /Ln are connected to the corresponding bit lines BL1, /BL1, ..., BLn, /BLn, and inputs a prescribed signal to the corresponding bit line, or outputs a signal obtained from the corresponding bit line to the outside of the memory cell array. At right end of each of the bit line signal input/output lines L1, /L1, ..., Ln, /Ln drawn out of the memory cell array, a bit line peripheral circuit 103 is connected.

In the conventional semiconductor memory device having the T-shaped bit line configuration, the bit line peripheral circuit 103 can be arranged because the bit line signal input/output lines L1, /L1, ..., Ln, /Ln are provided, and therefore the bit line peripheral circuits can be arranged dispersed in wider area. As a result, a large scale bit line peripheral circuit can be laid out without widening the bit line pitch. Further, when a bit line peripheral circuit of a fixed area is to be provided, the density of the memory cell array can be increased, realizing highly integrated semiconductor memory device.

The bit lines and the bit line signal input/output lines mentioned above will be discussed in greater detail. FIG. 14 shows line arrangement on a memory cell array of 4 rows×4 columns of the semiconductor memory device shown in FIG. 13.

Referring to FIG. 14, 16 memory cells MC each corresponding to 1 bit are arranged in 4 rows×4 columns. Bit lines BL0, /BL0, ..., /BL3 and /BL3 are formed by a first metal layer, on the memory cell array. Bit line signal input/output lines L, /L are formed by the second metal layer, orthogonally crossing bit lines BL0, /BL0, ... BL3 and /BL3. In the second metal layer, shield lines GND0 to GND3, input/output data lines IO and /IO, and a global word line GWL are arranged parallel to the bit line signal input/output lines L and /L. Bit lines BL0, /BL0, ..., BL3 and /BL3 and corresponding bit line signal input/output lines L and /L are connected through through holes TH1 and TH2. In FIG. 14, for example, bit line BL1 is connected to bit line signal input/output line L via thorough hole TH1, while bit line /BL1 is connected to bit line signal input/output line /L via through hole TH2.

A signal of a large amplitude flows through global word line GWL, while a signal of a small amplitude flows through bit line signal input/output lines L and /L and input/output data lines IO and /IO. Therefore, in order to prevent malfunction caused by the signal of the small amplitude receiving coupling noise from the signal of large amplitude, shield lines GND0 to GND3 which are low impedance shield lines at the shield potential are interposed.

Line pattern on the memory cell array when the above described semiconductor memory device is integrated to a higher degree will be described. FIG. 15 is a second diagram showing lines on the memory cell array of 4 rows×4 columns of the semiconductor memory device shown in FIG. 13. When the degree of integration of the memory cell array is increased, it becomes necessary to widen the width of bit lines BL1 and /BL1 around the through holes TH1 and TH2 so as to provide overlapping margin of through holes TH1 and TH2 and bit lines BL1 and /BL1, as shown in FIG. 15. In other words, higher degree of integration of the memory cell array can be implemented by making wider the bit lines BL1 and /BL1 around the through holes as shown in FIG. 15.

However, if the memory cell array of the conventional semiconductor memory device described above is to be integrated to a still higher degree, the space between bit lines around the through hole becomes too narrow, and hence there is a limit in increasing the degree of integration. FIG. 16 shows a specific layout pattern of the memory cell array of the semiconductor memory device shown in FIG. 13. When the width of bit line signal input/output lines L and /L is made 1.0 μm and space therebetween is set to 0.6 μm, the width of bit lines BL and /BL are made 0.6 μm and the space therebetween is set to 0.9 μm, one side of the through holes TH1 and TH2 is made 0.6 μm and the margin of bit lines BL and /BL for the through holes TH1 and TH2 are made 0.3 μm in order to further increase the degree of integration of the memory cell array of the semiconductor memory device, then the minimum space between the bit lines BL and /BL defined by the portion A would be 0.5 μm. If the minimum space between the lines is set to 0.6 μm, the portion A, which is 0.5 μm, does not satisfy this condition, and hence higher degree of integration is impossible.

SUMMARY OF THE INVENTION

An object of the present invention is to provide a semiconductor memory device suitable for higher degree of integration.

Another object of the present invention is to provide a semiconductor memory device which is suitable for higher degree of integration and which facilitates formation of patterns.

A still another object of the present invention is to provide a semiconductor memory device which is suitable for higher degree of integration and which facilitates formation of patterns.

A still another object of the present invention is to provide a semiconductor memory device which is suitable for higher degree of integration and which can prevent malfunction.

A still another object of the present invention is to provide a semiconductor memory device which is suitable for higher degree of integration, prevents malfunction and reduces current consumption.

According to an aspect of the present invention, the semiconductor memory device includes a memory cell array including a plurality of word lines, a plurality of first bit lines arranged crossing the word lines, and a plurality of memory cells arranged at crossings of the word lines and the first bit lines, and second bit lines arranged crossing the first bit lines, each connected to a corresponding first bit line and having at least one end extending to an end portion of the memory cell array, in which first bit lines adjacent to each other are connected to second bit lines which are not adjacent to each other.

By this structure, first bit lines which are adjacent to each other are connected to second bit lines which are not adjacent to each other, whereby the space between the second bit lines can be made wider, which enables higher degree of integration of the memory cell array.

According to another aspect of the present invention, the semiconductor memory device includes a memory cell array including a plurality of word lines, a plurality of first bit lines crossing the word lines, and a plurality of memory cells arranged at crossings of the word lines and the first bit lines, and second bit lines arranged crossing the first bit lines, each connected to corresponding one of the first bit lines, and having at least one end extending to an end portion of the memory cell array, in which line pattern of the first bit line positioned in the periphery of a connecting portion of the first and second bit lines is deformed to detour the connecting portion.

By the above described structure, since the line pattern of the first bit line positioned at the periphery of the connecting portion is deformed to detour the connecting portion, the minimum space between the first bit lines can be widened, enabling higher degree of integration of the memory cell array.

According to still another aspect of the present invention, the semiconductor memory device includes a memory cell array including a plurality of word lines, a plurality of first bit lines arranged crossing the word lines, and a plurality of memory cells arranged at crossings between the word lines and the first bit lines, a signal line arranged crossing the first bit lines and precharged to a prescribed potential, and a shield line arranged adjacent to the signal line and having the same potential as the prescribed potential.

By this structure, since a shield line having the same potential as the precharge potential of the signal line is arranged adjacent to the signal line, flow of a large current during precharging can be prevented even when the shield line and the signal line are short-circuited. Therefore, higher degree of integration can be attained while power consumption of the device can be reduced.

According to a still further aspect of the present invention, the semiconductor memory device includes a memory cell array including a plurality of word lines, a plurality of first bit lines arranged crossing the word lines, and a plurality of memory cells arranged at crossings between the word lines and the first bit lines, a signal line arranged crossing the first bit lines and used for selecting a memory cell, and a shield line arranged adjacent to the signal line and having the same potential as that of the signal line in a non-selected state of the memory cell.

By this structure, since a shield line having the same potential as that of the signal line in the non-selected state of the memory cell is arranged adjacent to the signal line, the memory cell can be kept at the non-selected state even when the signal line and the shield line are short-circuited. Therefore, multiple selection of the memory cells can be avoided, and malfunction of the device can be prevented, while higher degree of integration is attained.

According to still another aspect of the present invention, the semiconductor memory device includes a memory cell array including a plurality of word lines, a plurality of first bit lines arranged crossing the word lines, and a plurality of memory cells arranged at crossings between the word lines and the first bit lines, second bit lines arranged crossing the first bit lines, each connected to a corresponding one of the first bit lines and having at least one end extending to an end portion of the memory cell array, the first bit lines being divided into groups such that adjacent first bit lines belong to different groups, and the semiconductor memory device further includes a redundant circuit provided for each group of the first bit lines for repairing a defect of the memory cell upon reception of a signal from the second bit line.

By the above described structure, since a redundant circuit is provided for each group of the first bit lines which are grouped such that adjacent first bit lines belong to different groups, even when there are defects in adjacent two columns of memory cells, it can be repaired by each repairing circuit, and therefore it is not necessary to provide two stages of redundant circuits.

Namely, even when there are defects in continuous two columns, each defect can be repaired by the redundant circuit provided for each group, whereby the circuit scale is not increased, which contribute to higher degree of integration.

According to a still further aspect of the present invention, the semiconductor memory device includes a memory cell array including n rows of word lines, n columns of first bit lines arranged crossing the word lines, memory cells arranged at crossings between the word lines and the first bit lines, a rows of redundant word lines arranged parallel to the word lines, b columns of redundant bit lines arranged crossing the redundant word lines, and redundant memory cells arranged at crossings between the redundant word lines and the redundant bit lines; and second bit lines arranged crossing the first bit lines in a same pattern at every k rows, each connected to a corresponding one of the first bit lines or the redundant bit lines, with at least one end of each extending to an end portion of the memory cell array; in which the following expression holds:

$$k \times m \leq n \leq (k+1) \times m \text{ and } k \times b \leq a.$$

Since this expression is satisfied, the relation $(m+b) \times k \leq (n+a)$ holds, and therefore even when redundant memory cell array is added to the memory cell array not including the redundant memory cell, the second bit lines can be arranged in the same pattern at every k rows. Therefore, layout width of the peripheral circuit can be increased, enabling higher degree of integration.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
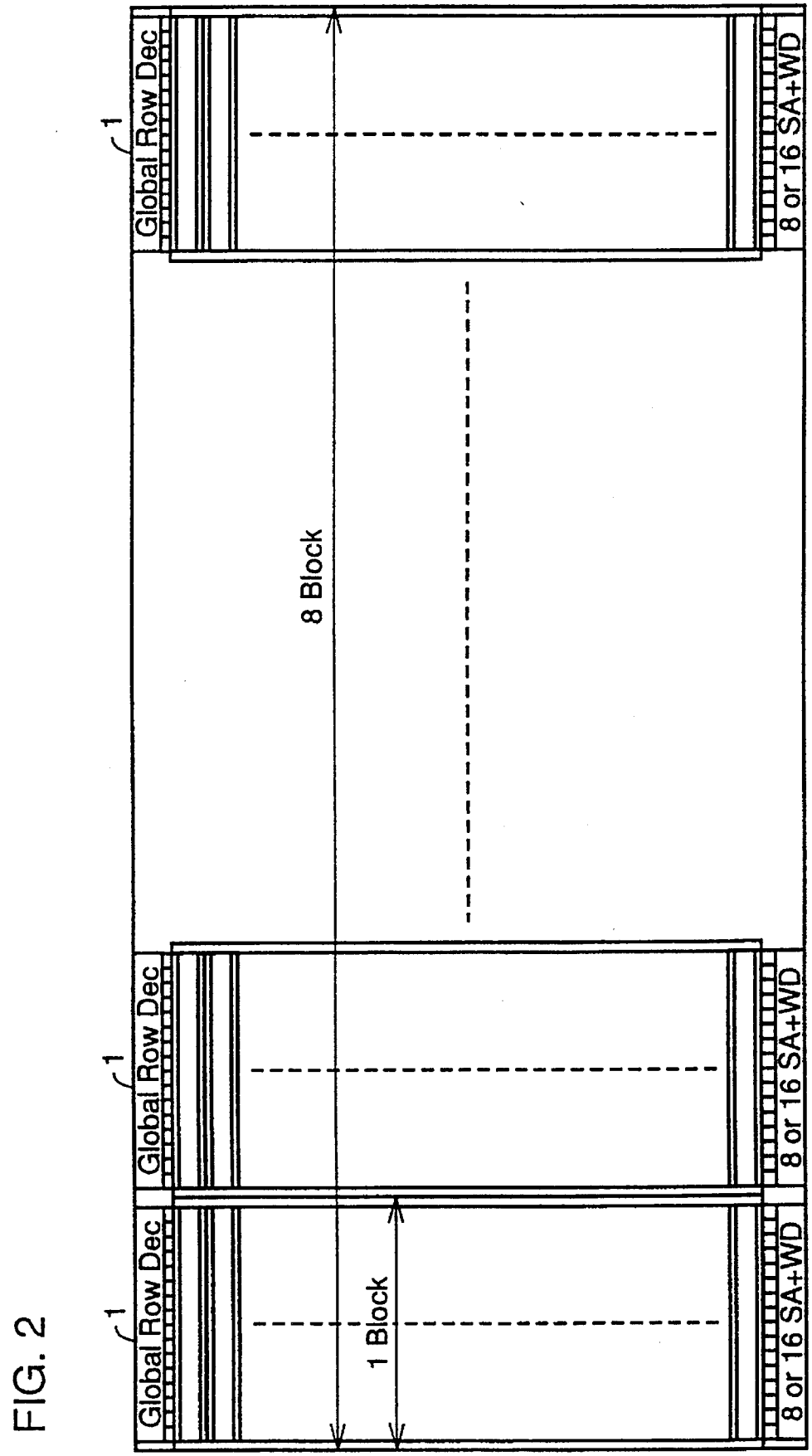
FIG. 2 shows a structure of a semiconductor memory device in accordance with a first embodiment of the present invention.

An SRAM (Static Random Access Memory) which is a semiconductor memory device in accordance with a first embodiment of the present invention will be described with reference to the figures. FIG. 2 shows a structure of the semiconductor memory device in accordance with the first embodiment of the present invention, and FIG. 3 shows the structure of the memory block shown in FIG. 2.

Referring to FIG. 2, the semiconductor memory device includes 8 memory blocks 1. 8 memory blocks 1 each having the capacity of 512 k bit are arranged in parallel, so that the capacity as a whole is 4 Mbit.

Figure 3:
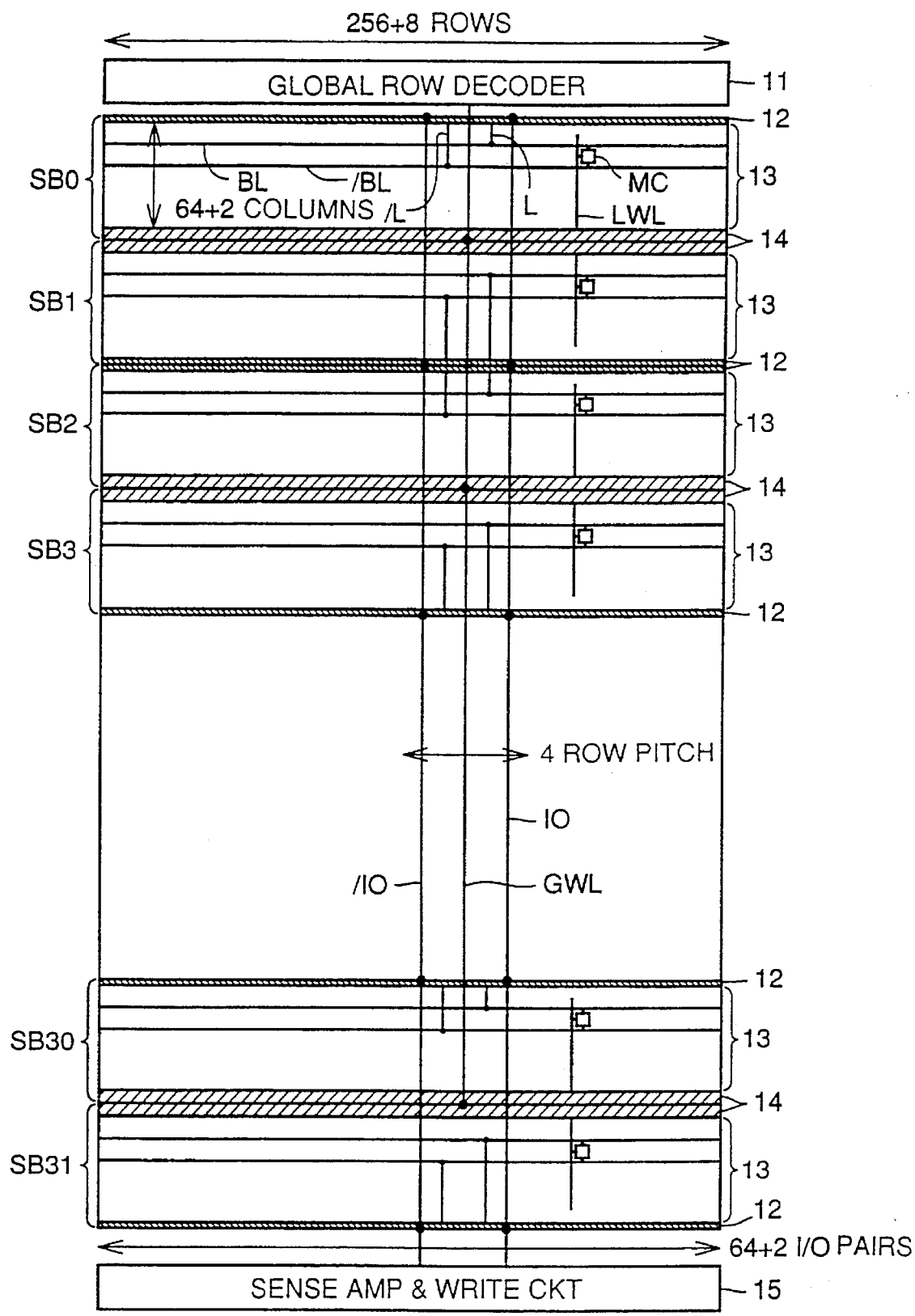
FIG. 3 shows a structure of the memory block shown in FIG. 2.

Referring to FIG. 3, the memory block includes a global row decoder 11, 32 small blocks SB0 to SB31, and a sense amplifier and write circuit 15. Each of the small blocks SB0 to SB31 includes a transfer gate portion 12, a memory cell array 13 and a local row decoder 14.

Each of the small blocks SB0 to SB31 consists of 256+8 rows and 62+2 columns, and has a storage capacity of 16 k bit. Therefore, the memory block as a whole has the storage capacity of 512 k bit.

Memory cell array 13 includes a plurality of bit lines BL, /BL, a plurality of local word lines LWL, a plurality of memory cells MC and a plurality of bit line signal input/output lines L, /L. Bit lines BL, /BL and local word lines LWL are arranged crossing with each other, and a memory cell MC is arranged at each crossing. Bit line signal input/output lines L, /L are arranged to be cross-connected bit lines BL, /BL. In this embodiment, since each of small blocks SB0 to SB31 consists of 256 rows and 64 columns, bit line signal input/output lines L, /L are connected to bit lines BL, /BL at every 4 rows, that is, 256/64=4 rows. This space can be arbitrarily set dependent on the numbers of rows and columns.

In each of the small blocks SB0 to SB31, a global word line GWL and data input/output lines IO, /IO are arranged. Global word line GWL is connected to global row decoder 11, and data input/output lines IO, /IO are connected to the sense amplifier and write circuit 15.

Figure 1:
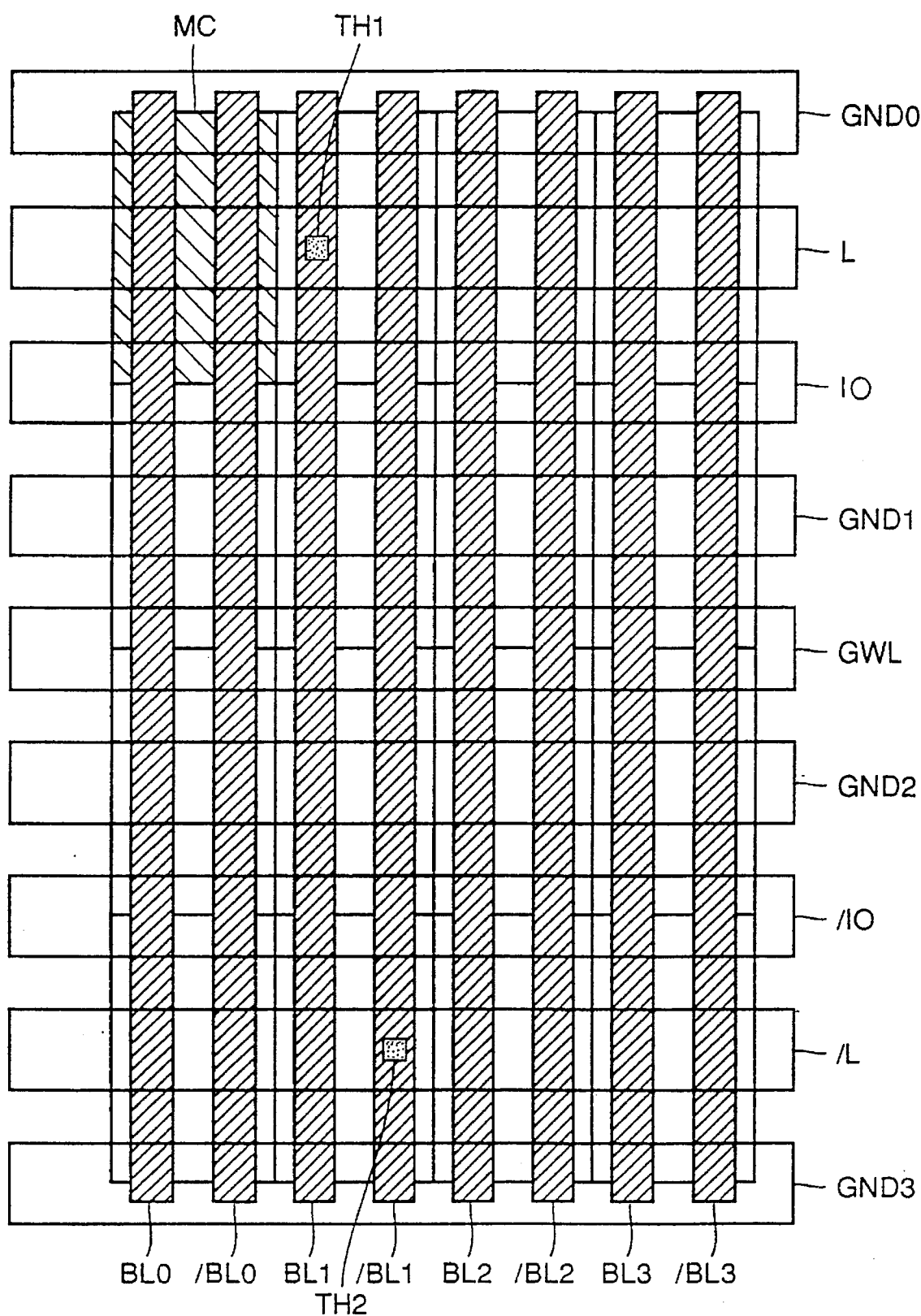
FIG. 1 shows a line pattern of 4 rows×4 columns of the memory cell array shown in FIG. 3.

The line pattern of memory cell array 13 shown in FIG. 3 will be described. FIG. 1 shows the line pattern of 4 rows×4 columns of the memory cell array shown in FIG. 3.

Referring to FIG. 1, the memory cell array includes bit lines BL0, /BL0, ..., BL3 and /BL3, shield lines GND0 to GND3, bit line signal input/output lines L and /L, data input/output lines IO and /IO, a global word line GWL and memory cells MC.

Figure 16:
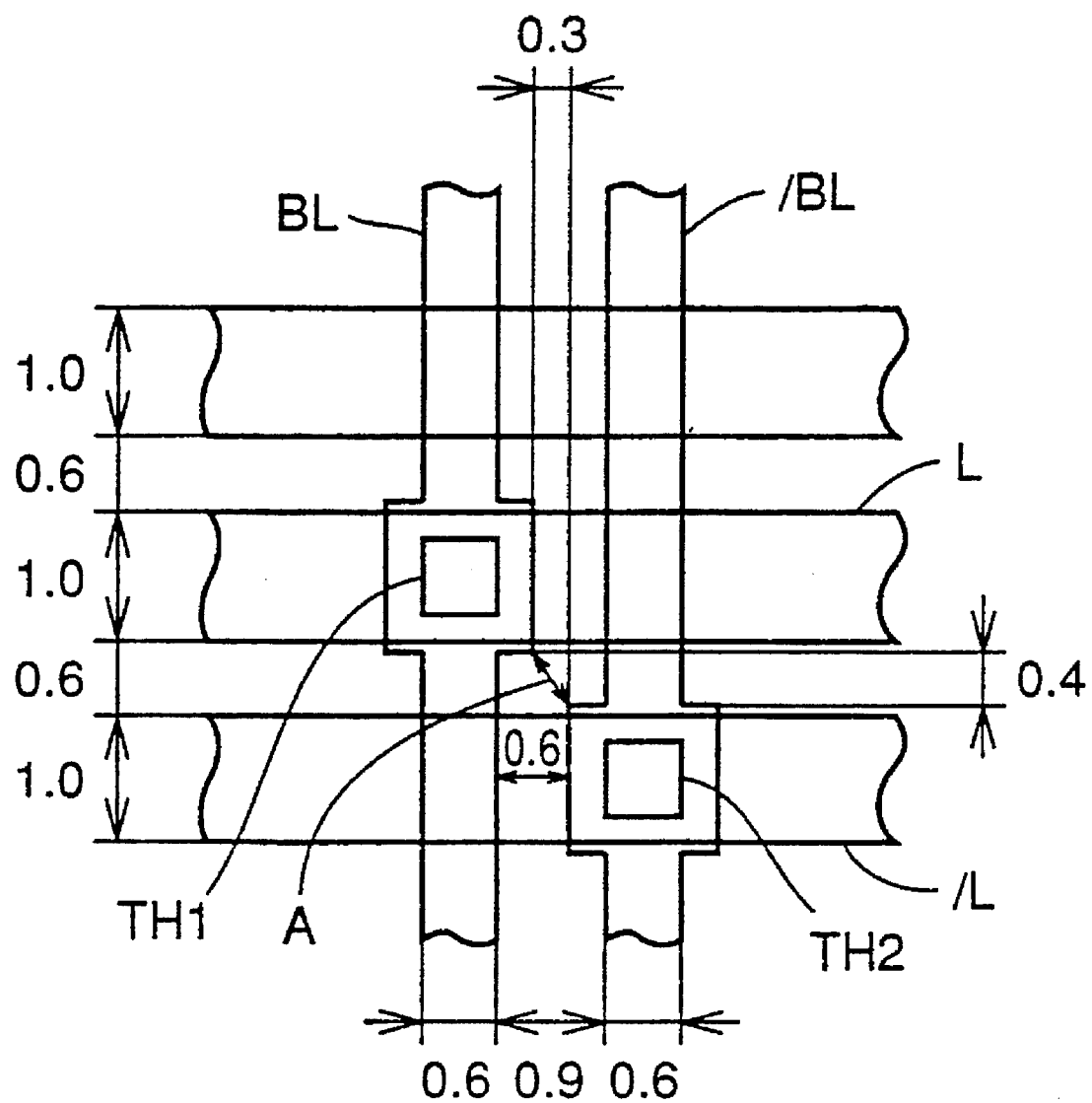
FIG. 16 shows a specific layout pattern of the memory cell array of the semiconductor memory device shown in FIG. 13.

The plurality of memory cells MC are arranged in 4 rows×4 columns, and for each memory cell MC, a pair of bit lines BL0, /BL0, ..., BL3, /BL3 is formed by the first metal layer. Shield lines GND0 to GND3, bit line signal input/ output lines L, /L, data input/output lines IO, /IO and global word line GWL are formed crossing bit lines GL0, /GL0, . . . , BL3 and /BL3, by a second metal layer. Here, the first and second metal layers simply refer to different interconnection layers, and the terms first and second do not represent any positional relation such as upper or lower layer. For example, bit line signal input/output line L is connected via through hole TH1 to bit line BL1, and bit line signal input/output line /L is connected via through hole TH2 to bit line /BL1. At this time, between bit line signal input/output lines L and /L, there are five lines, that is, two data input/output line IO and /IO, two shield lines GND1 and GND2, and global word line GWL arranged therebetween, so that the space between through holes TH1 and TH2 is widened, and the minimum space between the lines is not narrowed by the provision of through holes. Therefore, higher degree of integration of the memory cell array is possible. More specifically, even when such a layout as shown in FIG. 16 is employed, the minimum space between the lines is not defined by the space between the through holes. Accordingly, every space between the lines can be made 0.6 μm. Though five lines are arranged between the bit line signal input/output lines L and /L in the above described embodiment, the same effect can be obtained when there is at least one line between the lines L and /L. In other words, the above described effect can be obtained by connecting bit lines which are adjacent to each other to bit line signal input/output lines which are not adjacent to each other.

In the line pattern shown in FIG. 1, between the bit line signal input/output lines L, /L and data input/output lines IO, /IO which are transmitting signals of small amplitude and the global word line GWL which is transmitting a signal of large amplitude, shield lines GND1 and GND2 at the ground potential are arranged. Therefore, signals having small amplitude do not receive the coupling noise from the signal having large amplitude, and thus stable operation can be realized.

Figure 4:
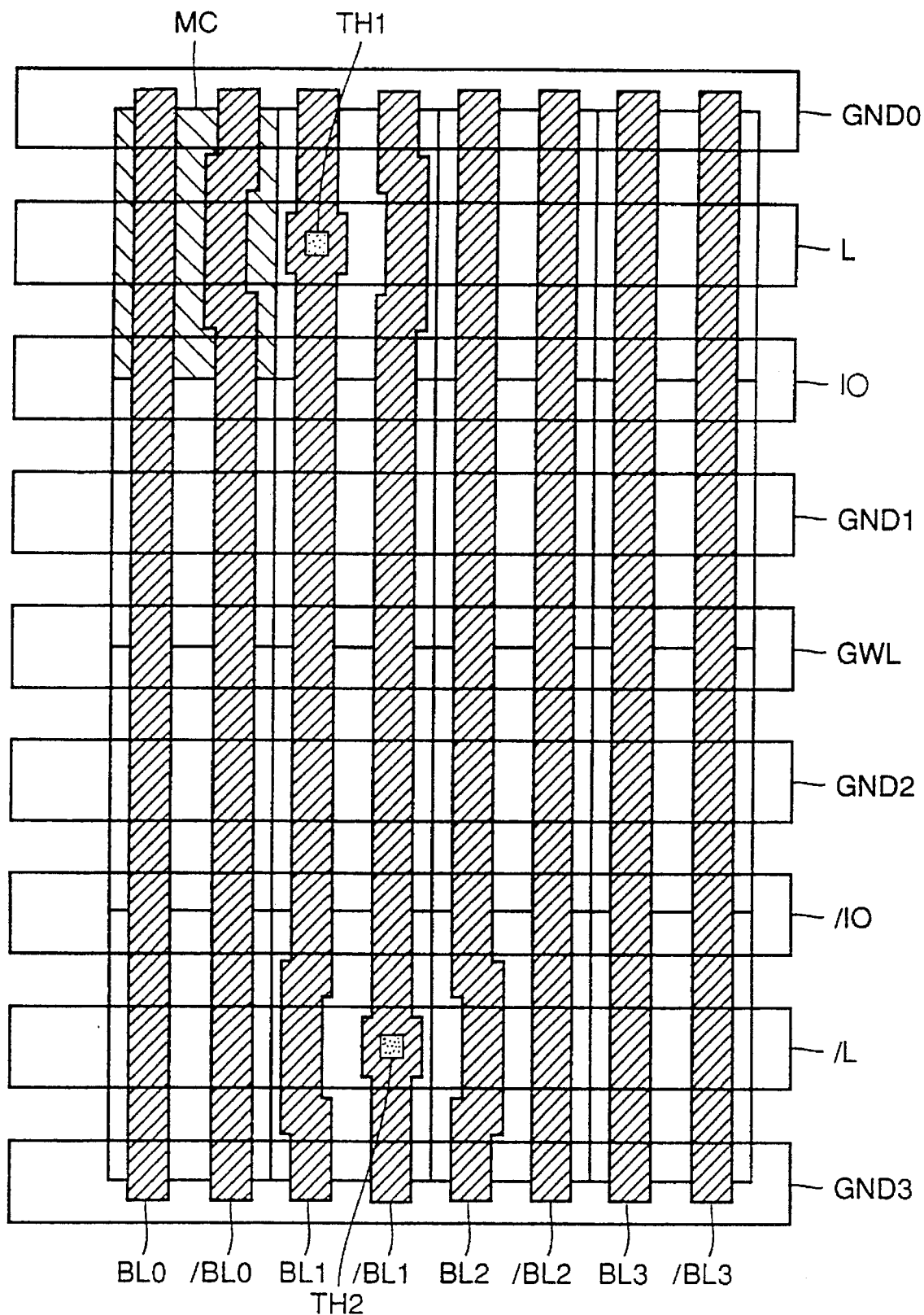
FIG. 4 shows a line pattern of 4 rows×4 columns of the memory cell array of a semiconductor memory device in accordance with a second embodiment of the present invention.

A semiconductor memory device in accordance with a second embodiment of the present invention will be described. FIG. 4 shows a line pattern of 4 rows×4 columns of the memory cell array of the semiconductor memory device in accordance with the second embodiment of the present invention. The whole structure of the semiconductor memory device in accordance with the second embodiment is similar to that of the semiconductor memory device shown in FIGS. 1 and 2, and therefore description thereof is not repeated.

Figure 14:
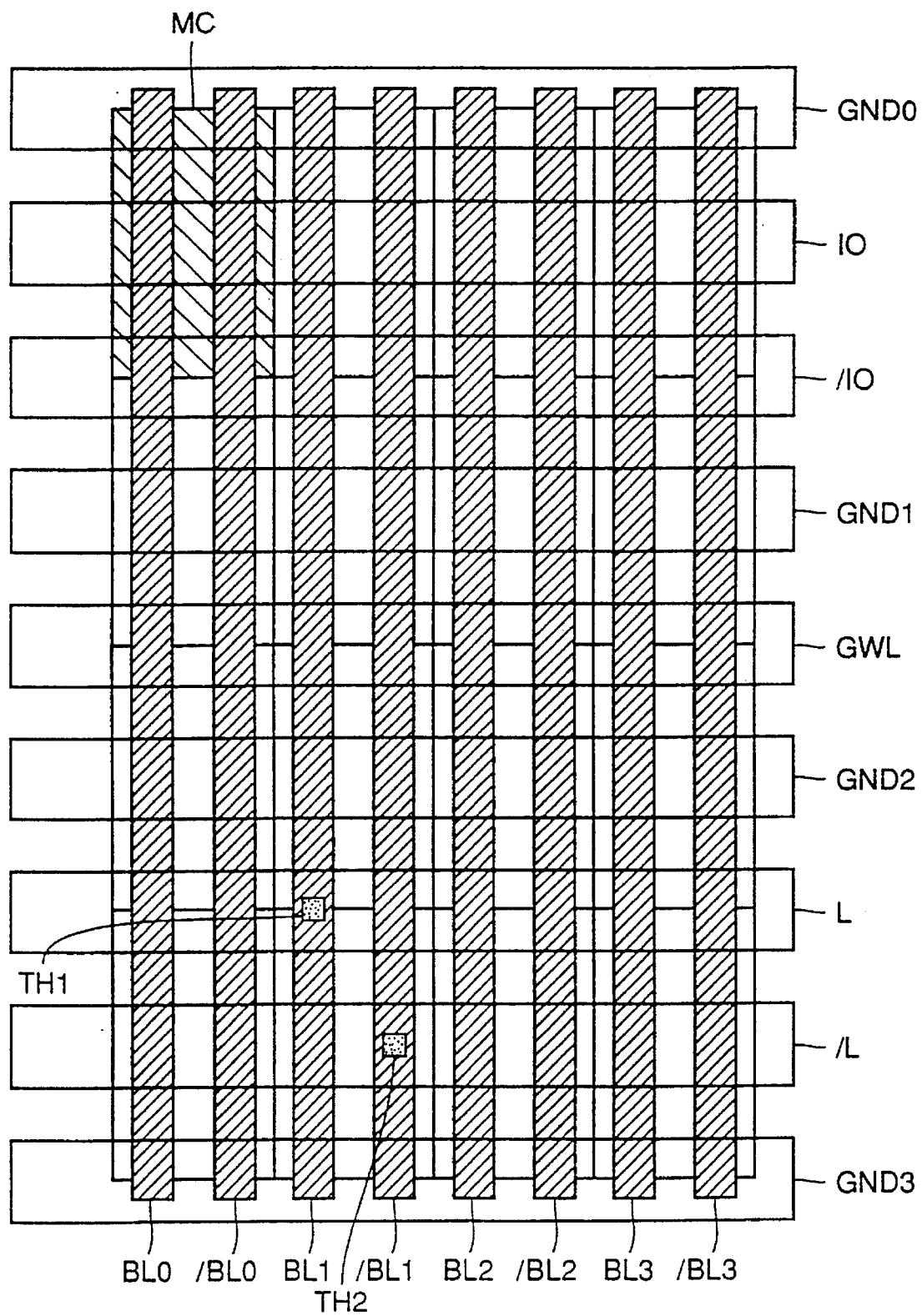
FIG. 14 is a first diagram showing line pattern of 4 rows×4 columns of the memory cell array of the semiconductor memory device shown in FIG. 13.
Figure 15:
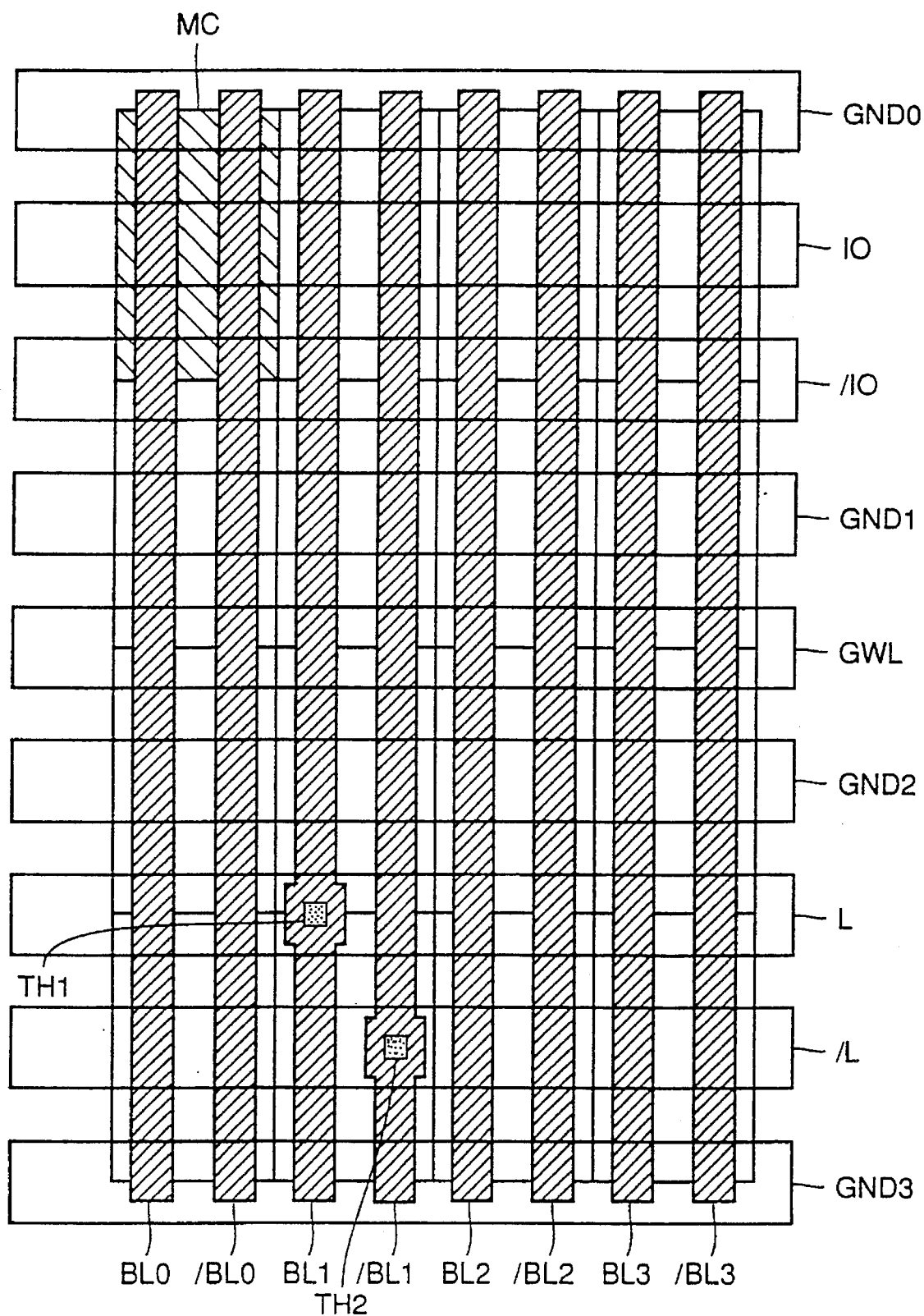
FIG. 15 is a second diagram showing line pattern of 4 rows×4 columns of the memory cell array of the semiconductor memory device shown in FIG. 13.

The pattern shown in FIG. 4 differs from the pattern shown in FIG. 1 in that the width of bit lines BL1, /BL1 at which through holes TH1 and TH2 are formed are widened, and that line pattern is deformed such that bit lines /BL0, /BL1, BL1 and BL2 near the through holes TH1 and TH2 detour the connecting portion of the through holes TH1 and TH2. In the T-shaped bit line configuration, the number of through holes connected to each bit line is generally 1, and it is not connected to the line of the same second metal layer. Therefore, through holes are not arranged adjacent to each other. The through holes are arranged most close to each other when the bit line signal input/output lines L and /L are arranged adjacent to each other such as shown in FIGS. 14 and 15. Therefore, it is possible to arrange one and another through holes not adjacent from each other. As a result, when connection margin of bit lines BL1 and /BL1 with respect to the through holes TH1 and TH2 are enlarged and the line width of bit lines BL1 and /BL1 are widened as shown in FIG. 4, the design rule of the bit lines can be released by changing the line pattern of bit lines /BL0, BL1, /BL1 and BL2 neared bit lines BL1 and /BL2 to which through holes TH1 and TH2 are connected so as to detour the through holes TH1 and TH2, while not changing the line space between bit lines BL0, /BL0, . . . , BL3 and /BL3, whereby the area of the memory cell array can be reduced. This leads to higher degree of integration of the semiconductor memory device.

Though through holes TH1 and TH2 are apart from each other in the example of FIG. 4, the same also applies to the example of FIGS. 14 and 15 in which through holes are at the closest positions.

Figure 5:
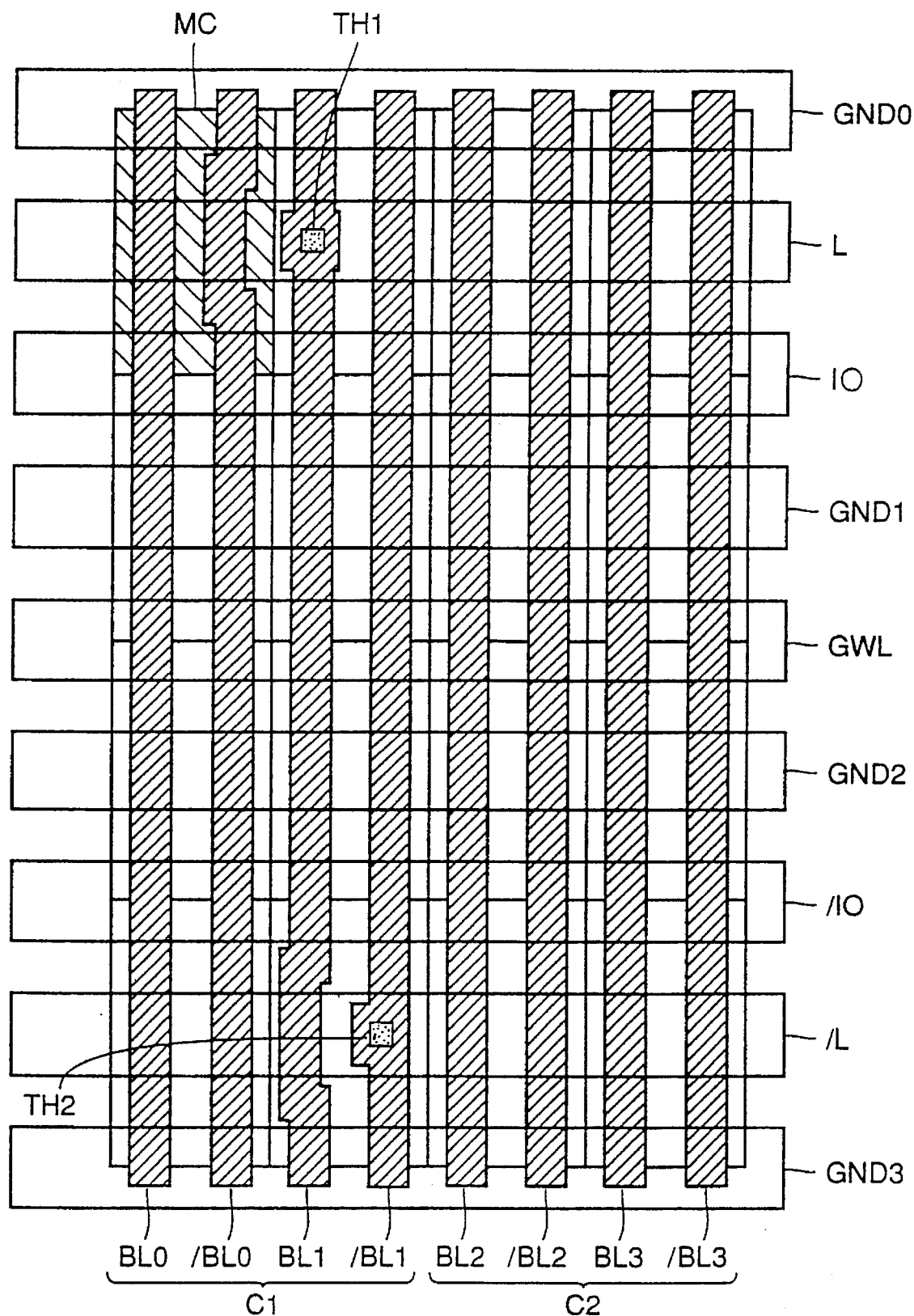
FIG. 5 shows a line pattern of 4 rows×4 columns of the memory cell array of a semiconductor memory device in accordance with a third embodiment of the present invention.

The semiconductor memory device in accordance with a third embodiment of the present invention will be described. FIG. 5 shows a line pattern of 4 rows×4 columns of the memory cell array of the semiconductor memory device in accordance with the third embodiment of the present invention.

The line pattern shown in FIG. 5 differs from the line pattern of FIG. 4 in that the bit line is not deformed at the boundary between bit lines /BL1 and BL2. Namely, the bit line is not deformed at the boundary of one or a plurality of memory cell columns. More specifically, through holes TH1 and TH2 are shifted from the center of bit lines BL1 and /BL1, the width of each bit line BL1, /BL1 is widened so that left and right connection margins are the same, and the line pattern of bit lines /BL0 and BL1 therearound are deformed so as to detour the through holes TH1 and TH2. Therefore, the same effect as in the second embodiment can be obtained. In this embodiment, it becomes possible to form every pattern of the first metal layer on the memory cell array simply by using two patterns, that is, a column C1 including a through hole connection and a column C2 not including the through hole connection. This means that the number of repetition of the pattern is increased. Therefore, the amount of data of the patterns can be reduced, so that preparation of photomask is facilitated and the cost during manufacturing can be reduced.

Figure 6:
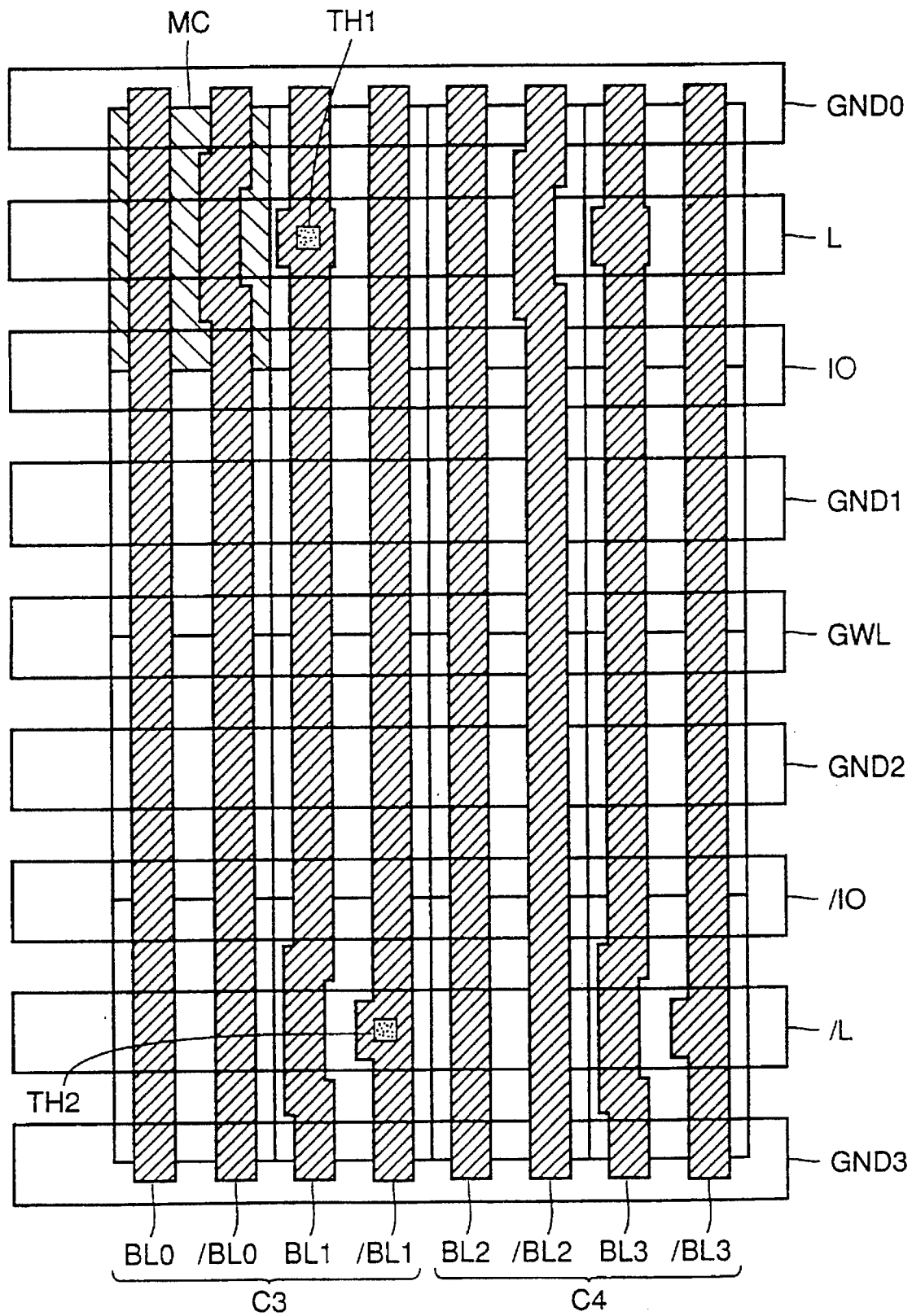
FIG. 6 shows a line pattern of 4 rows×4 columns of the memory cell array of a semiconductor memory device in accordance with a fourth embodiment of the present invention.

The semiconductor memory device in accordance with a fourth embodiment of the present invention will be described. FIG. 6 shows a line pattern of 4 rows×4 columns of the memory cell array of the semiconductor memory device in accordance with the fourth embodiment of the present invention.

The pattern shown in FIG. 6 differs from the pattern of FIG. 5 in that the same pattern is used for a pattern C3 of bit lines BL0, /BL0, BL1, /BL1 including portions to which through holes TH1 and TH2 are connected and for a pattern C4 including bit lines BL2, /BL2, BL3, /BL3 not including the portion to which a through hole is connected. As already described in the second embodiment, generally, connection by the through hole is one for one bit line. Therefore, the number of through holes in the memory cell array is very small. Therefore, when the pattern of the bit line is deformed only at the connecting portion of the through hole as in the second and the third embodiments, it becomes difficult to find the deformed pattern of the bit line at the connecting portion which is derived from the through hole, in a pattern inspection by a microscope, for example, during the manufacturing process. When the pattern C3 of the bit line including the connecting portion for the through hole is also used for the pattern C4 of the bit line not including the connecting portion such as shown in FIG. 6, a defect such as short-circuit caused by insufficient margin, for example, can be readily found during the pattern inspection, which makes easier the step of inspection for higher integrated devices.

Further, the number of repetition of the pattern is increased as in the third embodiment, so that the amount of data of the patterns can be reduced, and the cost for preparing the photomask can be reduced.

Figure 7:
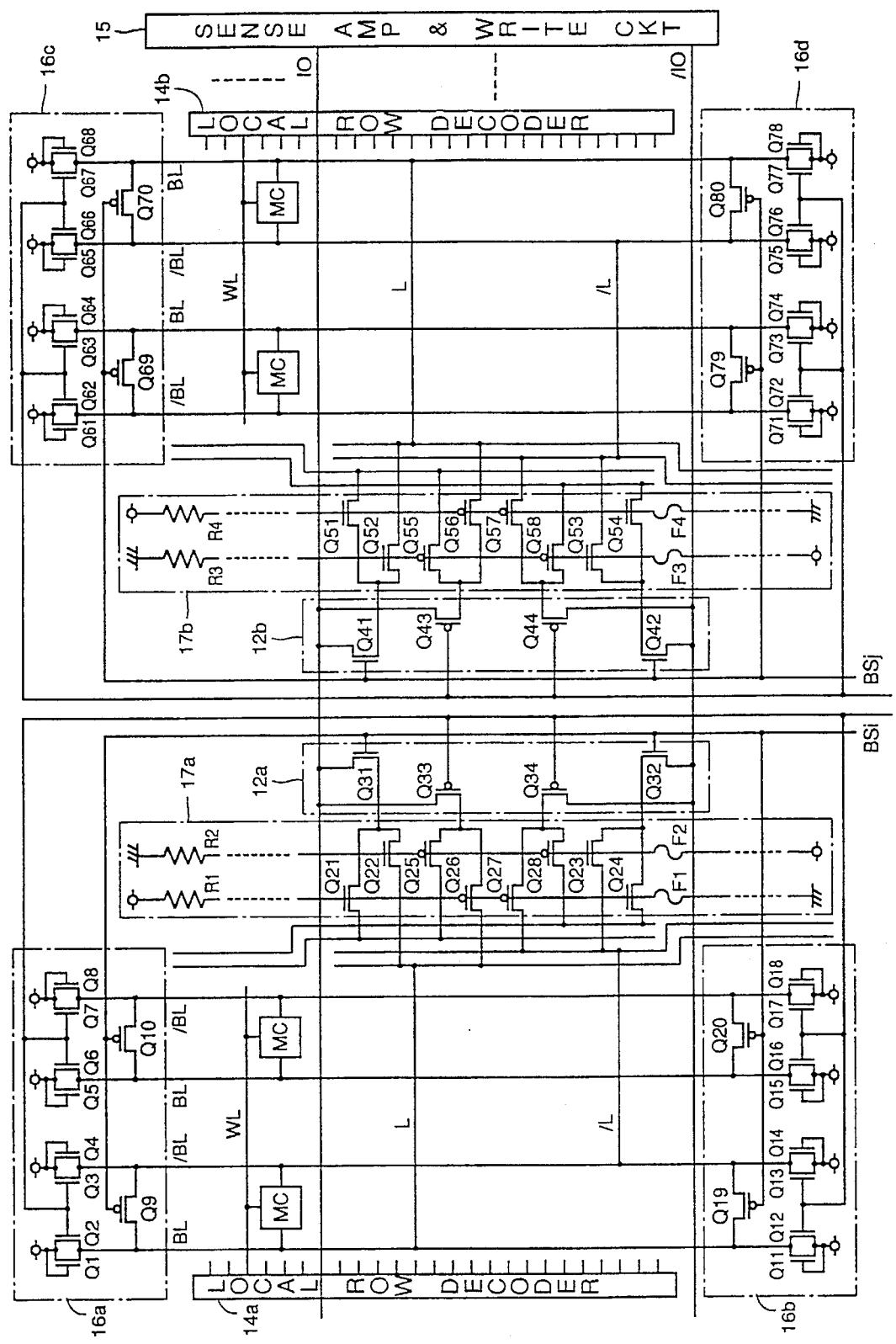
FIG. 7 shows a structure of a memory cell array and peripheral circuitry of a semiconductor memory device in accordance with a fifth embodiment of the present invention.

The semiconductor memory device in accordance with a fifth embodiment of the present invention will be described. FIG. 7 shows a structure of a memory cell array and peripheral circuitry of the semiconductor memory device in accordance with the fifth embodiment of the present invention. Referring to FIG. 7, the semiconductor memory device includes word lines WL, bit lines BL, /BL1, memory cells MC, bit line signal input/output lines L, /L, transfer gate portions 12a, 12b, local row decoders 14a, 14b, bit line precharge circuits 16a to 16d, shift redundancy circuits 17a, 17b, and a sense amplifier and write circuit 15.

Bit line precharge circuit 16a includes NMOS transistors Q1 to Q8 and PMOS transistors Q9 and Q10. Other bit line precharge circuits 16b to 16d have the similar structures. Bit line precharge circuits 16a to 16d precharge a predetermined bit line to the supply potential Vdd.

Shift redundancy circuit 17a includes resistors R1 and R2, NMOS transistors Q21 to Q24, PMOS transistors Q25 to Q28 and fuse elements F1 and F2. Shift redundancy circuit 17b has the same structure as shift redundancy circuit 17a. Shift redundancy circuit 17a switches connection between bit line signal input/output lines L and /L and transfer gate portion 12a by blowing off fuse element F1 or F2, so as to switch a defective memory cell to a redundant memory cell, for repairing the defective memory cell.

Transfer gate portion 12a includes NMOS transistors Q31 and Q32 and PMOS transistors Q33 and Q34. Transfer gate portion 12b has the similar structure as transfer gate portion 12a. Transfer gate portion 12a provides a data signal output from shift redundancy circuit 17a to the sense amplifier and write circuit 15 through data input/output lines IO, /IO.

As described above, bit line signal input/output lines L, /L are connected to data input/output lines IO, /IO through shift redundancy circuit 17a and transfer gate portion 12a. More specifically, by arranging data input/output line IO adjacent to bit line input/output line L and arranging data input/output line /IO adjacent to bit line signal input/output line /L, it becomes possible to directly connect adjacent bit line signal input/output lines to data input/output lines, facilitating connection between respective lines. More specifically, when bit line signal input/output lines L and /L and data input/output lines IO, /IO are arranged in a pattern such as shown in FIGS. 14 and 15, connection between respective lines overlap with each other, increasing line area. However, when bit line input/output lines L, /L and data input/output lines IO, /IO are arranged as shown in FIGS. 3 and 7, the layout area of the memory cell array and the peripheral circuitry can be reduced, which contributes to higher degree of integration.

Figure 8:
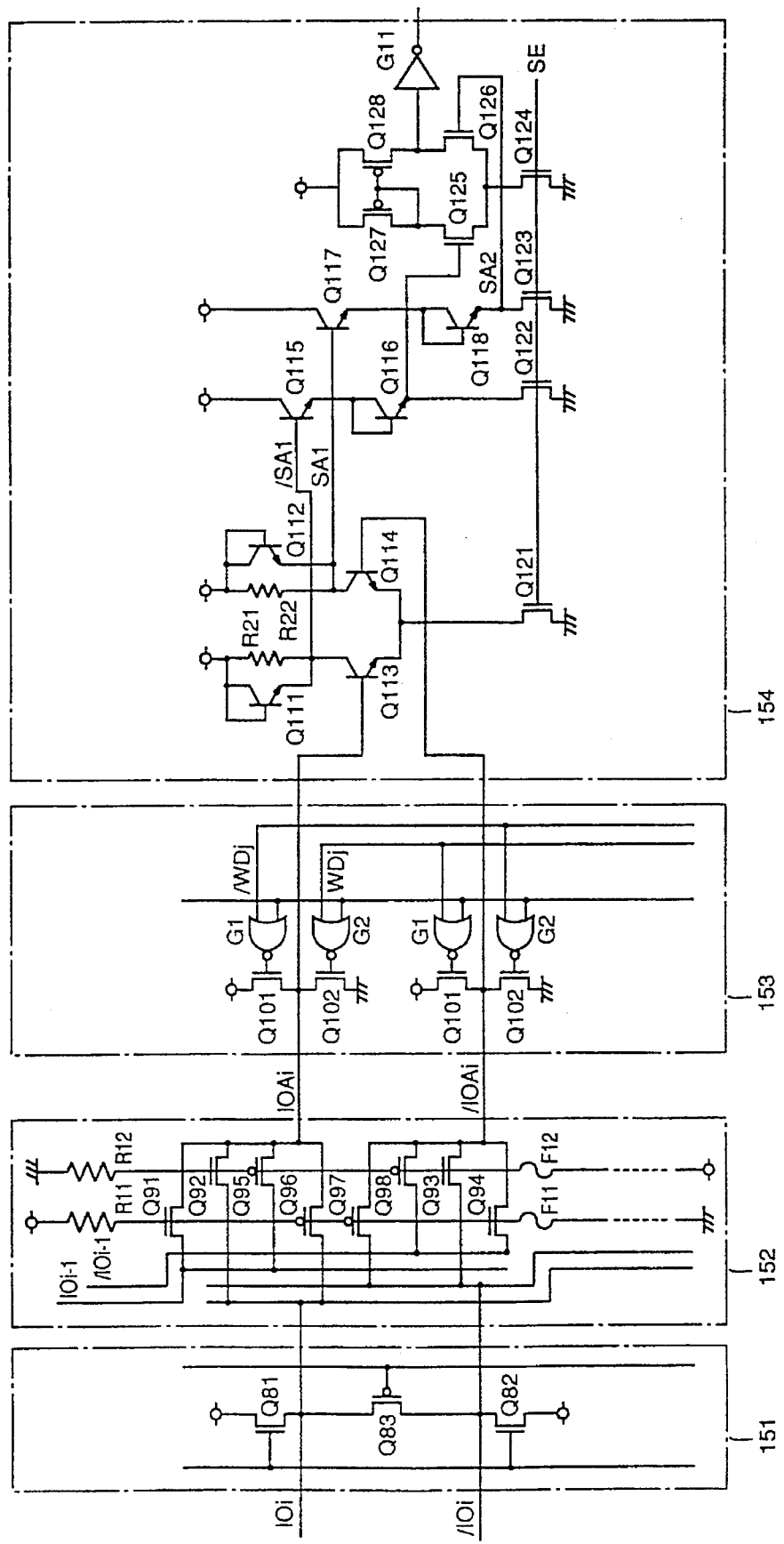
FIG. 8 is a schematic diagram showing a structure of a sense amplifier and write circuit shown in FIG. 7.

The sense amplifier and write circuit shown in FIG. 7 will be described in detail. FIG. 8 is a schematic diagram showing the structure of the sense amplifier and write circuit shown in FIG. 7. Referring to FIG. 8, the sense amplifier and write circuit includes an I/O line precharge circuit 151, a shift redundancy circuit 152, a write circuit 153 and a sense amplifier 154. I/O line precharge circuit 151 includes NMOS transistors Q81 and Q82 and a PMOS transistor Q83. I/O precharge circuit 151 precharges data input/output lines IOi and /IOi to the supply potential Vdd.

Shift redundancy circuit 152 includes resistors R11 and R12, NMOS transistors Q91 to Q94, PMOS transistors Q95 to Q98 and fuse elements F11 and F12. Shift redundancy circuit 152 switches connection of data input/output lines IOi and /IOi by blowing off fuse element F11 or F12.

Write circuit 153 includes NMOS transistors Q101 to Q104 and NOR gates G1 to G4. Write circuit 153 writes prescribed data through data input/output line IOi, /IOi.

Sense amplifier 154 includes resistors R21 and R22, transistors Q111 to Q118, NMOS transistors Q121 to Q126, PMOS transistors Q127 and Q128, and an inverter G11. Sense amplifier 153 amplifies and outputs a data input signal input through data input/output line IOi, /IOi.

Figure 9:
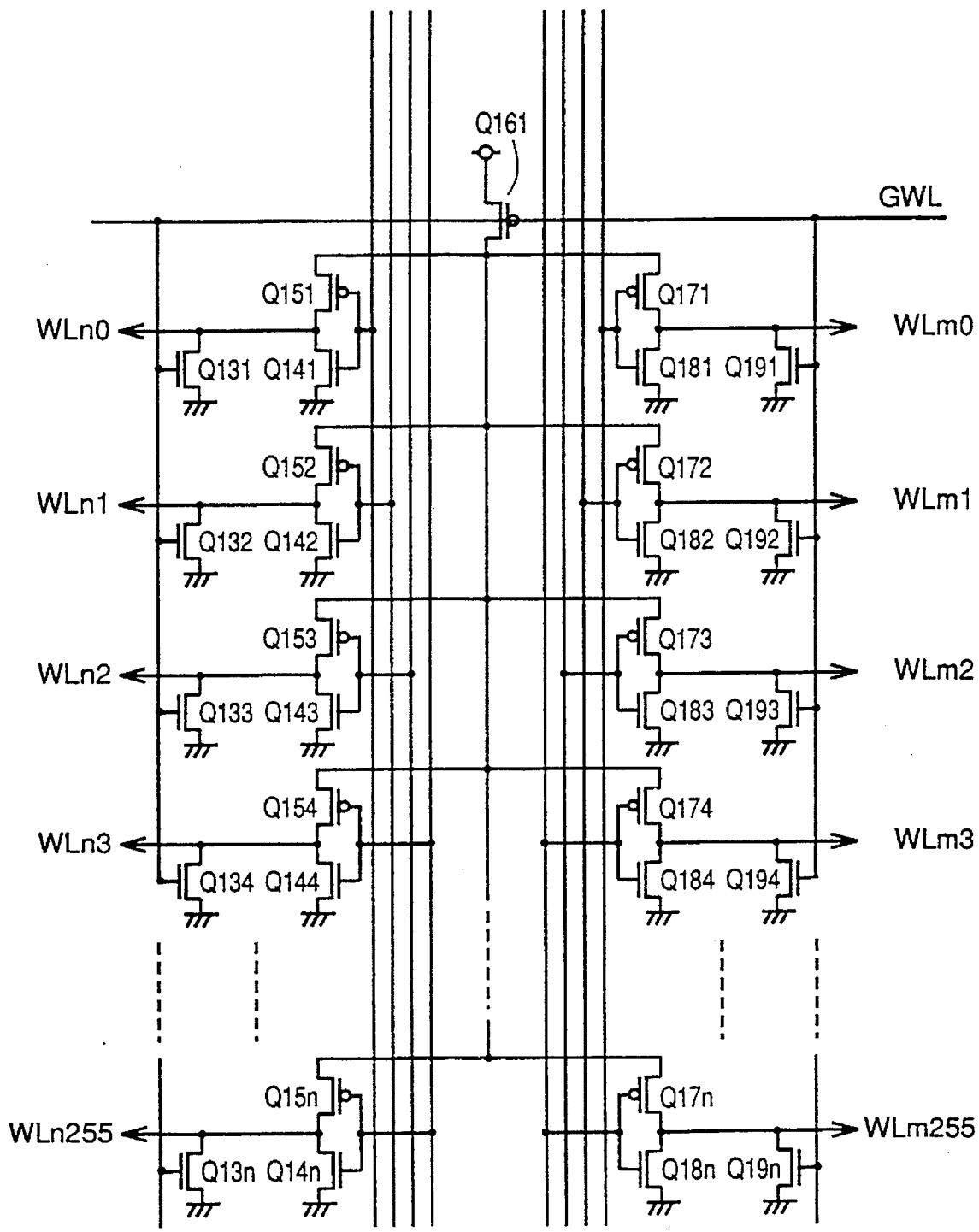
FIG. 9 is a schematic diagram showing a structure of a local row decoder shown in FIG. 7.

The local row decoder shown in FIG. 7 will be described. FIG. 9 is a schematic diagram showing the structure of the local row decoder shown in FIG. 7.

Referring to FIG. 9, the local row decoder includes NMOS transistors Q131 to Q13n, Q141 to Q14n, Q181 to Q18n, Q191 to Q19n, and PMOS transistors Q151 to Q15n, Q161, Q171 to Q17n. The local row decoder corresponds to two blocks of the memory cell array, and has 256 word line outputs WLn 0 to WLn 255 for one block and 256 word line outputs WLn 0 to WLm 255 for the other block. In the example of FIG. 9, in the local row decoder, word line outputs WLn 0 to WLn 3 and WLm 0 to WLm 3 are set to the selected state when the global GWL is at "L", and the outputs are set to the non-selected state when it is at the "H" level.

Figure 10:
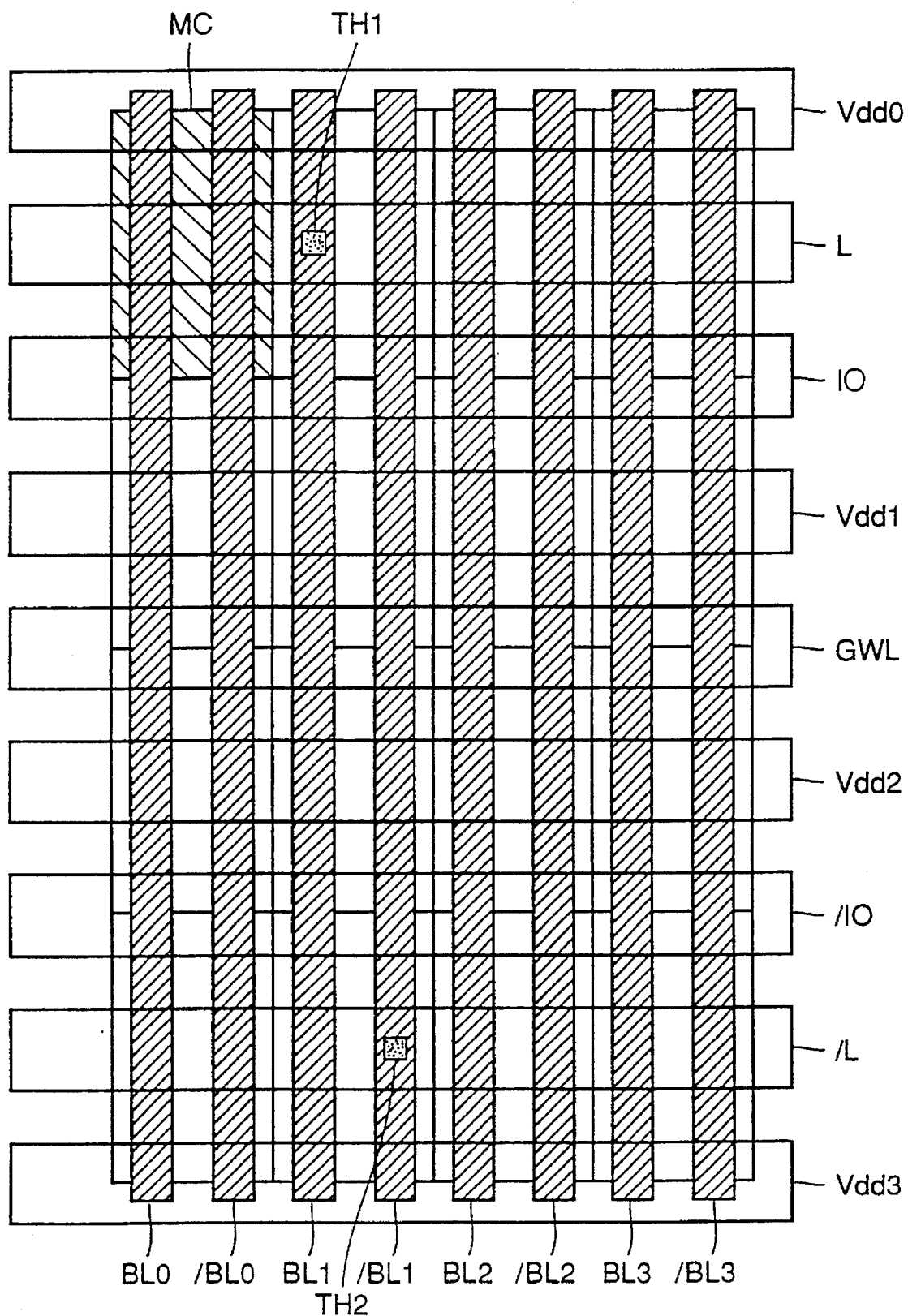
FIG. 10 shows a line pattern of 4 rows×4 columns of the memory cell array of a semiconductor memory device shown in FIG. 7.

The line pattern of the memory cell array of the semiconductor memory device shown in FIG. 7 will be described. FIG. 10 shows a line pattern of the memory cell array of 4 rows×4 columns of the semiconductor memory device shown in FIG. 7.

The line pattern shown in FIG. 10 differs from that of FIG. 4 in that shield lines GND 0 to GND 3 at the ground potential are replaced by shield lines Vdd 0 to Vdd 3 having the same potential as the reference potential (for example, supply potential or ground potential) of the precharge circuits 16a to 16d and 151 shown in FIGS. 7 and 8. In FIG. 10, bit lines BL0, /BL0, . . . , BL3, /BL3 are precharged to the supply potential, bit line signal input/output lines L and /L are also precharged to the supply potential, and data input/output lines IO and /IO are also precharged to the supply potential. Therefore, the potentials of shield lines Vdd 0 to Vdd 3 are set to the supply potential. Therefore, even when there is a short circuit between the shield lines Vdd 0 to Vdd 3 and each of the signal lines L, /L, IO, /IO, flow of a large amount of current during precharging can be prevented, and even after a defective memory cell is repaired by the shift redundancy circuit as in this embodiment, the current consumption is not increased. Therefore the power consumption of the semiconductor memory device can be reduced.

In the line pattern shown in FIG. 10, the potentials of shield lines Vdd 1 and Vdd 2 adjacent to the signal line related to the selection of the memory cell such as the global word line GWL are also set to "H" (supply potential) which corresponds to the non-selected state of the memory cell, and therefore even when there is a short circuit between shield line Vdd 1 or Vdd 2 and global word line GWL, the memory cell can be kept at the non-selected state. Therefore, multiple selection of the memory cells can be prevented, defect of the memory cell can be repaired by the shift redundancy circuit, and therefore reliability of the device is improved and malfunction can be prevented.

In the above described embodiment, the potential of the shield line is the same as the reference potential for precharging and the potential when the memory cell is non-selected. If these potentials differ, respective shield lines may be set to the respective potentials to obtain the same effect.

Figure 11:
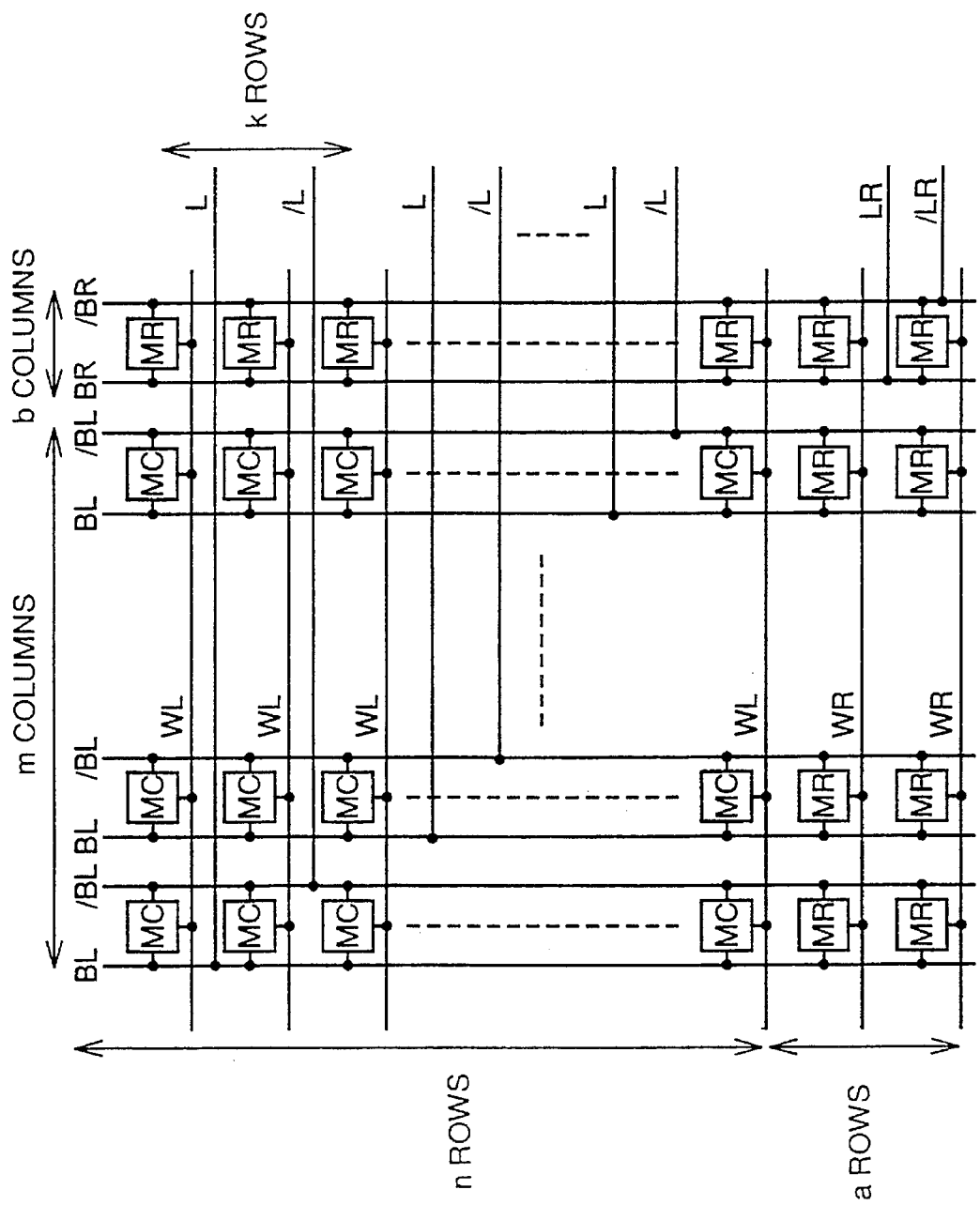
FIG. 11 shows a structure of the memory cell array of a semiconductor memory device in accordance with a sixth embodiment of the present invention.

The semiconductor memory device in accordance with a sixth embodiment of the present invention will be described. When the potential of the shield line is set in the manner described above, it becomes necessary to provide a redundant memory cell to replace the defective memory cell in order to repair the defective memory cell by means of the shift redundancy circuit. Meanwhile, when the through holes are arranged separate from each other as in the first embodiment, the repetition interval of the bit line signal input/output lines (in the first example, every four rows) can be enlarged, and therefore the layout width of the peripheral circuitry connected to the bit line signal input/output line can be enlarged. Therefore, when redundant cells can be added while maintaining the repetition interval of the bit line signal input/output line the largest, the layout width of the peripheral circuitry can be enlarged, and higher degree of integration of the device can be realized. The semiconductor memory device of the present invention is such a memory device that allows addition of redundant memory cells while maintaining maximum repetition interval between the bit line signal input/output lines of the semiconductor memory device having T-shaped bit line configuration not including the redundant memory cell. FIG. 11 shows a structure of the memory cell array of the semiconductor memory device in accordance with the sixth embodiment of the present invention.

Referring to FIG. 11, the memory cell array of the semiconductor memory device includes n rows of word lines WL, m columns of bit lines BL, /BL, memory cells MC, a rows of redundant word lines WR, b columns of redundant bit lines BR, /BR, redundant memory cells MR and bit line signal input/output lines L, /L, LR and /LR arranged at every k rows.

First, let us consider only the n rows of word lines WL and m columns of bit lines BL, /BL. In order to maximize the repetition interval k of bit line signal input/output lines L and /L, the following relation must be satisfied:

$$k \times m \leq n \leq (k+1) \times m.$$

When a rows of redundant word lines WR and b columns of redundant bit lines BR and /BR are to be added, and a and b are selected to satisfy $a \geq b \times k$, the following relation holds.

$$(n+a) \geq (m+b) \times k.$$

Therefore, a memory array having the T-shaped bit line structure including redundant memory cells can be realized by using k rows, which is the maximum repetition interval of the T-shaped bit line structure not including the redundant memory cells. As a result, redundant memory cells can be added while maintaining the maximum repetition interval k of bit line signal input/output lines L and/L, and the layout width of the peripheral circuit can be enlarged. In other words, when the value k is small, there would be unnecessary portion at an end portion of the peripheral circuitry, and therefore chip area cannot be efficiently used. However, when the value k is large, there is not an unnecessary portion, and the chip area can be effectively used, the chip size can be reduced, and the degree of integration can be improved. The layout width of the peripheral circuitry is limited by the repetition interval k, while the length can be set arbitrarily. Therefore, when the layout width is widened, the layout of the peripheral circuitry is very much facilitated.

Figure 12:
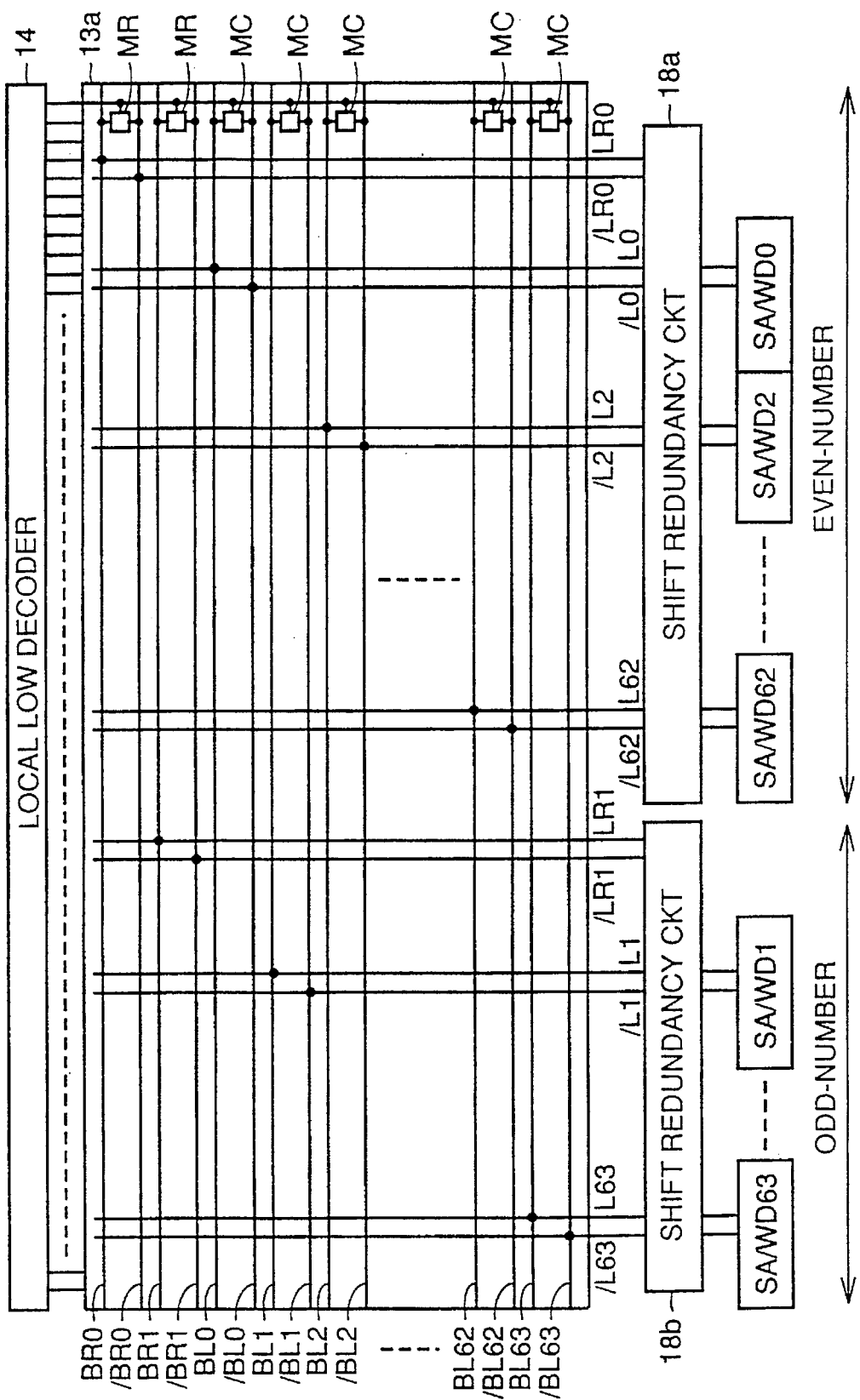
FIG. 12 shows a structure of the memory cell array and peripheral circuitry of a semiconductor memory device in accordance with a seventh embodiment of the present invention.
Figure 13:
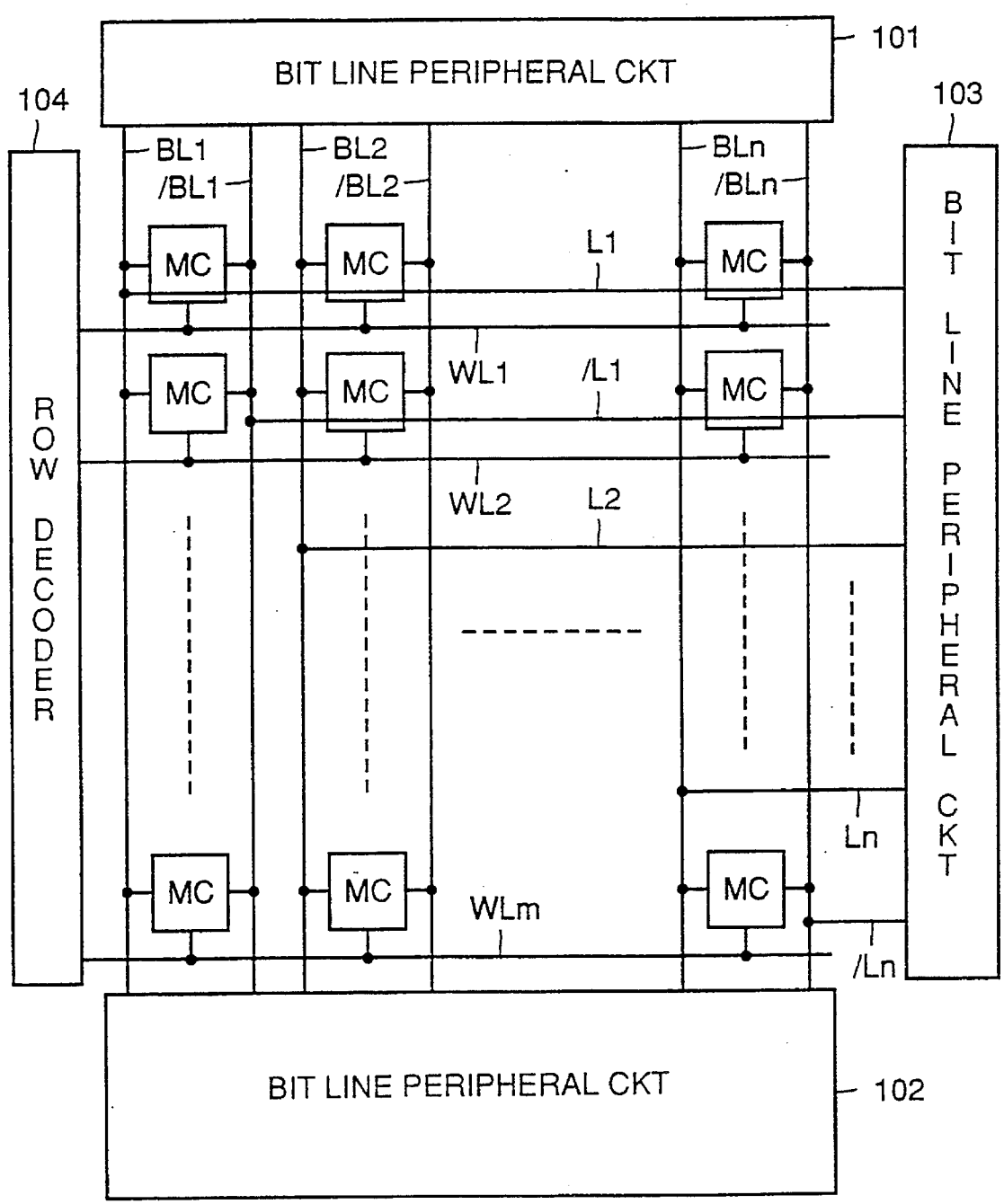
FIG. 13 shows a structure of a memory cell array and peripheral circuitry of a conventional semiconductor memory device.

A semiconductor memory device in accordance with a seventh embodiment of the present invention will be described. FIG. 12 shows the structure of the memory cell array and peripheral circuitry of the semiconductor memory device in accordance with the seventh embodiment of the present invention.

Referring to FIG. 12, the semiconductor memory device includes a local row decoder 14, shift redundancy circuits 18a and 18b, sense amplifier and write circuits SA/WD0 to SA/WD63, and a memory cell array 13a.

Memory cell array 13a includes two pairs of redundant bit lines BR0, /BR0, BR1, /BR1, 64 pairs of bit lines BL0, /BL0, . . . BL63, /BL63, redundant memory cells MR, memory cells MC, and two pairs of redundant bit line signal input/output lines LR0, /LR0, LR1, and /LR1.

To shift redundancy circuit 18a, bit line signal input/output lines and redundant bit line signal input/output lines, which are connected to 33 pairs of even-numbered bit lines and redundant bit lines, are connected. To the shift redundancy circuit 18b, bit line signal input lines and redundant bit line signal input lines which are connected to 33 pairs of odd-numbered bit lines and redundant bit lines, are connected. In other words, to the sift redundancy circuits 18a and 18b, signals from redundant bit lines and bit lines which are not adjacent to each other are input. As for the shift redundancy circuit 18a and 18b, the shift redundancy circuit such as shown in FIGS. 7 or 8 is used, and by blowing off an internal fuse element, an arbitrary 32 sets of bit line signal input/output lines and redundant bit line signal input/output line are selected from 33 sets of bit line signal input/output lines and redundant bit line signal input/output lines, which are connected to a total of 64 sense amplifier and write circuits SA/WD0 to SA/WD63. When bit lines of two sets of continuous memory cell columns are short-circuited by some defects on the memory cell array, there would be defects of two columns. At that time, signals from redundant bit lines and from bit lines which are not adjacent to each other are input to the two shift redundancy circuits 18a and 18b. Therefore, there is only one defective column in each shift redundancy circuit. Therefore, it is not necessary to provide two stages of shift redundancy circuits, and defects of two columns can be repaired by only one stage of shift redundancy circuit. Namely, since the adjacent bit lines and redundant bit lines are grouped so that adjacent ones belong to different groups, and a shift redundancy circuit is provided for each group, defects of continuous two columns can be repaired without two stages of shift redundancy circuits, whereby the circuit structure is simplified and the degree of integration can be increased.

Though SRAMs have been described in the above described embodiments, the present invention can be similarly applied to other semiconductor memory devices such as DRAMs (Dynamic Random Access Memories).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a memory cell array including a plurality of word lines, a plurality of first bit lines arranged crossing said word lines, and a plurality of memory cells arranged at crossings between said word lines and said first bit lines; and a plurality of second bit lines arranged crossing said first bit lines, each connected to a corresponding one of said first bit lines and having at least one end extending to an end portion of said memory cell array; wherein said first bit lines which are adjacent to each other are connected to said second bit lines which are not adjacent to each other.

2. The semiconductor memory device according to claim 1, wherein a line pattern of said first bit lines positioned in a periphery of a connecting portion of said first bit line and said second bit line is deformed to detour around the periphery of said connecting portion.

3. The semiconductor memory device according to claim 2, wherein a line pattern of said first bit line which is positioned other than the periphery of said connecting portion is also deformed in a similar manner as said first bit line positioned in the periphery of said connecting portion.

4. The semiconductor memory device according to claim 2, wherein the line pattern of said first bit lines on both sides of said connection portion are deformed in symmetry with respect to said connecting portion.

5. The semiconductor memory device according to claim 2, wherein the line pattern of one of said first bit lines positioned on both sides of said connecting portion is deformed more than the other one of said first bit lines.

6. The semiconductor memory device according to claim 2, further comprising:

a first signal line arranged crossing said first bit lines and precharged to a prescribed potential; and a first shield line arranged adjacent to said first signal line and having same potential as said prescribed potential; wherein said first signal line and said first shield line are formed by same interconnection layer as said second bit line.

7. The semiconductor memory device according to claim 6, further comprising a second signal line arranged crossing said first bit lines and used for selecting said memory cell; and a second shield line arranged adjacent to said second signal line and having same potential as said second signal line in a non-selected state of said memory cell; wherein said second signal line and said second shield line are formed by same interconnection layer as said second bit line.

8. A semiconductor memory device, comprising:

a memory cell array including a plurality of word lines, a plurality of first bit lines arranged crossing said word lines, and a plurality of memory cells arranged at crossings between said word lines and said first bit lines; and a plurality of second bit lines arranged crossing said first bit lines, each connected to corresponding one of said first bit lines and having at least one end extending to an end portion of said memory cell array; wherein a line pattern of said first bit lines positioned in a periphery of a connecting portion between said first and second bit lines is deformed to detour around the periphery of said connecting portion.

9. The semiconductor memory device according to claim 8, wherein a line pattern of said first bit line positioned other than the periphery of said connecting portion is deformed in a similar manner as the line pattern of said first bit line positioned in the periphery of said connecting portion.

10. The semiconductor memory device according to claim 8, wherein the line pattern of said first bit lines positioned on both sides of said connecting portion are deformed in symmetry with respect to said connecting portion.

11. The semiconductor memory device according to claim 8, wherein the line pattern of one of said first bit lines positioned on both sides of said connecting portion is deformed more than the line pattern of the other one of said first bit lines.

12. A semiconductor memory device, comprising:

a memory cell array including a plurality of word lines, a plurality of first bit lines arranged crossing said word lines and a plurality of memory cells arranged at crossings of said word lines and said first bit lines;

a signal line arranged crossing said first bit lines and precharged to a prescribed potential; and a shield line arranged adjacent to said signal line and having the same potential as said prescribed potential.

13. The semiconductor memory device according to claim 12, wherein said prescribed potential includes a power supply potential.

14. A semiconductor memory device, comprising:

a memory cell array including a plurality of word lines, a plurality of first bit lines arranged crossing said word lines and a plurality of memory cells arranged at crossings between said word lines and said first bit lines;

a signal line arranged crossing said first bit lines and used for selecting said memory cell; and a shield line arranged adjacent to said signal line and having same potential as that of said signal line in a non-selected state of said memory cell.

15. The semiconductor memory device according to claim 14, wherein said signal line includes a global word line, and said prescribed potential includes power supply potential.

* * * * *